United States Patent [19]

Crumbaker

[11] Patent Number: 5,653,807
[45] Date of Patent: Aug. 5, 1997

[54] LOW TEMPERATURE VAPOR PHASE EPITAXIAL SYSTEM FOR DEPOSITING THIN LAYERS OF SILICON-GERMANIUM ALLOY

[75] Inventor: Todd E. Crumbaker, N. Billerica, Mass.

[73] Assignee: The United States of America as represented by the Secretary of the Air Force, Washington, D.C.

[21] Appl. No.: 623,593

[22] Filed: Mar. 28, 1996

[51] Int. Cl.$^6$ ............................................. C23C 16/00
[52] U.S. Cl. ...................... 118/715; 204/298.07; 137/606
[58] Field of Search ........................ 118/715; 204/298.07; 137/240, 606

[56] References Cited

U.S. PATENT DOCUMENTS

| | | | |
|---|---|---|---|
| 4,625,627 | 12/1986 | Livanos | 98/32 |
| 4,703,718 | 11/1987 | Enstrom | 118/715 |
| 4,869,301 | 9/1989 | Ohmi | 141/85 |
| 4,907,534 | 3/1990 | Huang | 118/725 |
| 4,989,637 | 2/1991 | Dittrich | 137/599 |
| 5,123,375 | 6/1992 | Hansen | 118/715 |
| 5,163,475 | 11/1992 | Gregoire | 137/597 |
| 5,190,913 | 3/1993 | Higashiyama | 505/1 |
| 5,250,323 | 10/1993 | Miyazaki | 427/255.1 |
| 5,433,786 | 7/1995 | Hu | 118/723 E |
| 5,494,521 | 2/1996 | Otsuka | 118/715 |
| 5,516,366 | 5/1996 | Kanno | 118/715 |
| 5,554,226 | 9/1996 | Okase | 118/724 |
| 5,571,329 | 11/1996 | Chan | 118/715 |

*Primary Examiner*—Richard Bueker
*Assistant Examiner*—Jeffrie R. Lund
*Attorney, Agent, or Firm*—Robert L. Nathans

[57] ABSTRACT

An epitaxial film deposition system has a low vacuum venturi pump for initially partially purging the system of toxic gases, and a high vacuum turbo-molecular pump to further sharply reduce the pressure to maximize toxic gas purging along with the detection of any slight leaks of toxic gases in the system. A source gas mixing manifold has an array of gas feed lines layed out in a rectangular array for forwarding the gases to the reactor furnace, wherein each feed line has an equal path length between each run valve of the mixing manifold and the reactor to minimize switching transient variations.

13 Claims, 2 Drawing Sheets

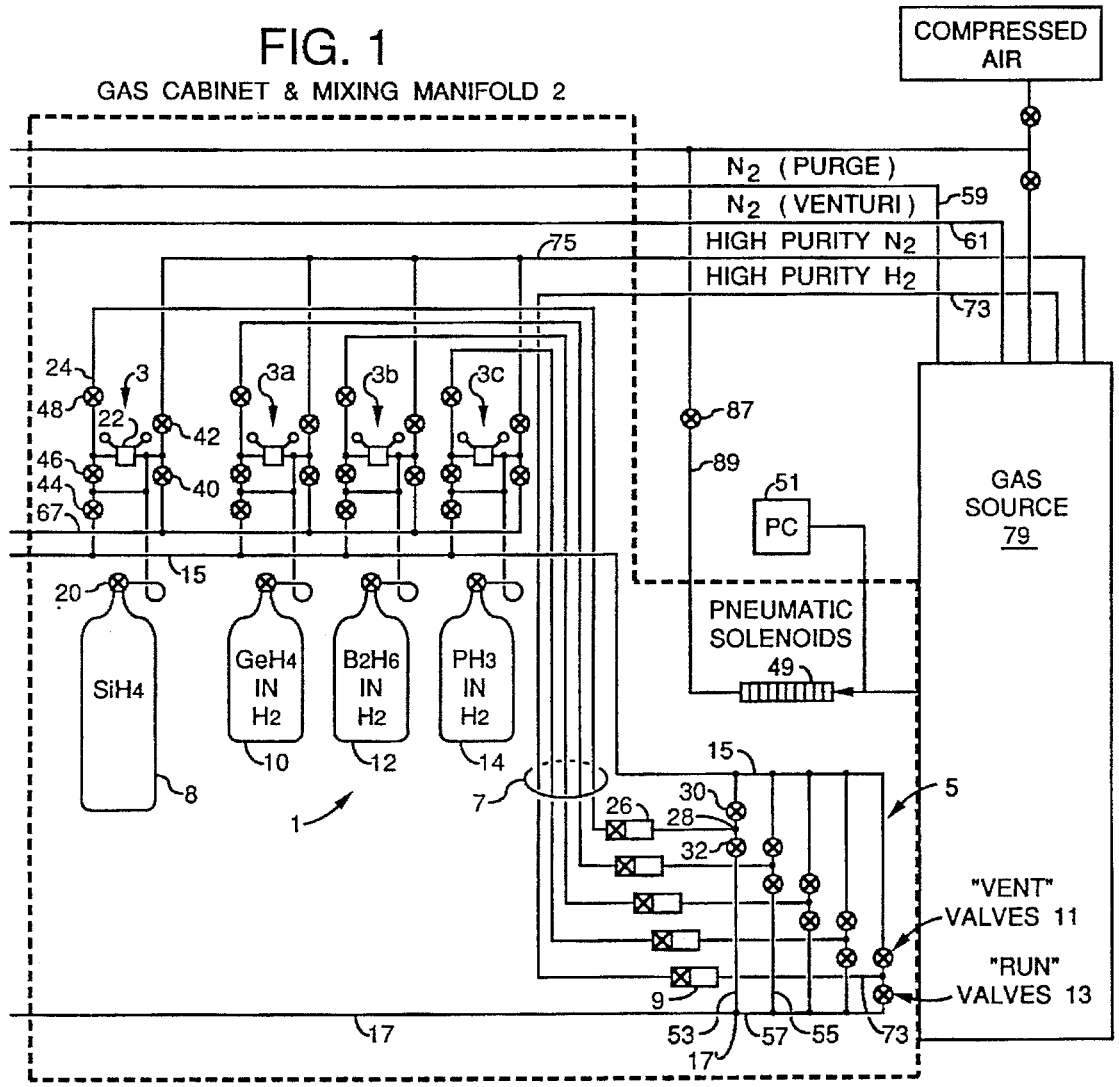

LOW TEMPERATURE VAPOR PHASE EPITAXIAL SYSTEM FOR DEPOSITING THIN LAYERS OF SILICON-GERMANIUM ALLOY

STATEMENT OF GOVERNMENT INTEREST

The invention described herein may be manufactured and used by or for the Government for governmental purposes without the payment of any royalty thereon.

BACKGROUND OF THE INVENTION

Low-temperature vapor phase epitaxial systems are known for producing thin layers of semiconducting silicon-germanium alloy. Such layers can be used by the semiconductor processing industry to expand the range of applications currently available to silicon. Addition of silicon-germanium layers to silicon technology permits operation of silicon-like integrated circuits at faster speeds than are attainable by silicon circuits themselves. In addition, silicon-germanium layers are sensitive to light at wavelengths used by modern fiber-optic networks, silicon layers are not. This means that photonic detectors made from silicon-germanium layers could be used at these wavelengths (1.1 $\mu<\lambda<1.9$ $\mu$m). The inherit compatibility of silicon-germanium layers with silicon processing technology thus enables silicon-like circuits to be used in conjunction with modern fiber-optic network systems, a capability that is not possible with silicon-only circuits today. Improvements are desired in the operation and flexibility of a machine capable of producing high quality silicon-germanium layers for use in the electronics and opto-electronics industries. The process of depositing single-crystal layers of silicon and silicon-germanium from gaseous sources at low temperature (~500° C.) was pioneered by Meyerson at IBM in the mid-to-late 1980's; see B. S. Meyerson; Low-Temperature Silicon Epoxy by Ultrahigh Vacuum/Chemical Vapor Deposition; Appl. Phys. Lett. 48 (12) 24 March 1986. As a result of this work, IBM has cooperated with Leybold A. G. who now produces a commercial ultra-high vacuum chemical vapor deposition system based on the IBM design. The only other commercial system of this type known to the author is manufactured by Vactronic, Inc. (Bohemia N.Y.).

It is desirable to provide a vapor phase epitaxial deposition system that has a very efficient and thorough toxic gas purging mechanism, in view of the extremely toxic nature of the source, or process, gases introduced into the reactor furnace, for producing the thin epitaxial layers upon the silicon wafers positioned therein. It is also highly desirable to rapidly detect the slightest leak of the highly toxic gases before such a leak can become dangerous to the health of operating personnel. Finally, even minute leaks in the gas distribution system can lead to unacceptably high levels of contamination in the resulting silicon-germanium layers.

It is also deemed desirable to readily counteract any potential deviation in the proper ratios of two or more source gases to be simultaneously introduced into the reactor furnace, which deviation could result in undesirable changes in the composition of the epitaxial films being deposited.

BRIEF SUMMARY OF THE INVENTION

The aforesaid goals have been met in accordance with the preferred embodiment of the invention by providing a film deposition system having a low vacuum venturi pump for initially partially purging the system of toxic gases, and for reducing the pressure so that a high vacuum turbo-molecular pump can thereafter function to further sharply reduce the pressure to maximize toxic gas purging and any slight leaks of toxic gases in the system. A source gas mixing manifold has a rectangular array of gas feed lines for fowarding the gases to the reactor furnace via a common run line, wherein each feed line has an equal path length between each nm valve of the mixing manifold and the reactor, thereby to minimize the aforesaid potential deviation in the proper ratio of the source gases as they are introduced into the reactor.

BRIEF DESCRIPTION OF THE DRAWINGS

Other features and advantages of the invention will become more apparent upon study of the following description, taken in conjunction with the drawings in which:

FIG. 1 discloses the gas cabinet and mixing manifold of the system;

FIG. 3 illustrates the gas source portion of the system;

DETAILED DESCRIPTION OF A PREFERRED EMBODIMENT OF THE INVENTION

Figure 4:
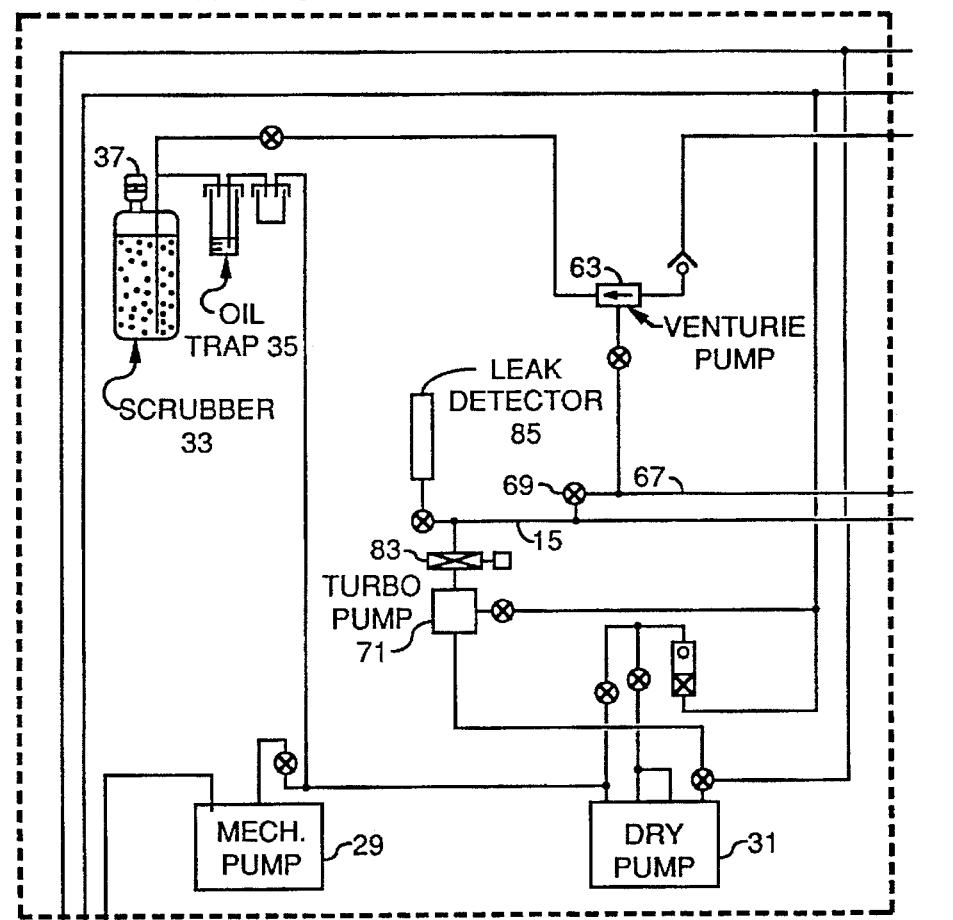
FIG. 4 illustrates the mechanical pump/scrubber cabinet of the system.
Figure 2:
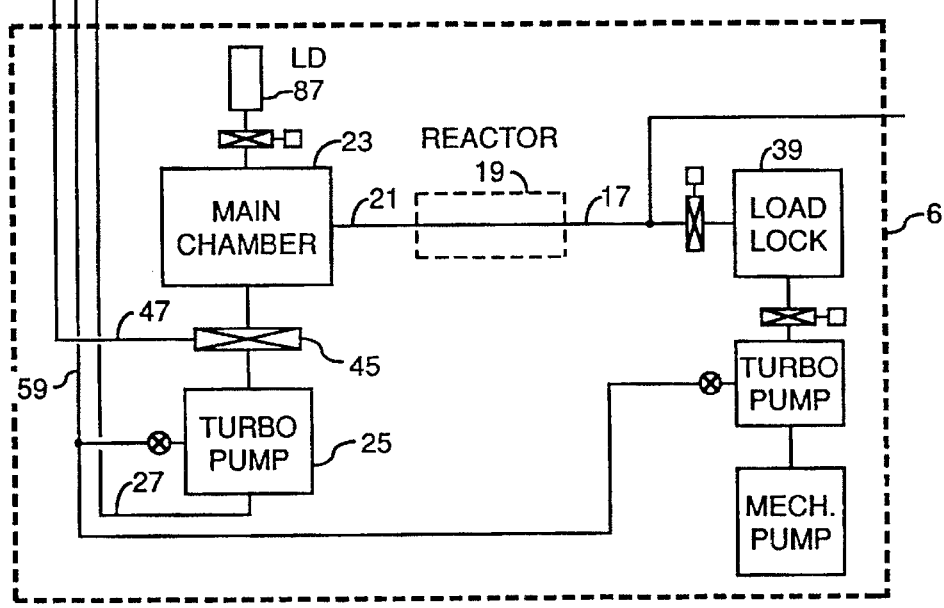
FIG. 2 discloses the reactor portion of the system.

FIG. 1 discloses the gas cabinet and mixing manifold 2 comprising a bank of purge panels 3 coupled between a bank of source or process gas cylinders 1 and gas mixing manifold 5, which mixes the gases and conveys them to the reactor furnace 19 of FIG. 2, via line 17 for creating the thin films on the semiconductor wafers in the furnace. The boat containing the wafers is loaded into the furnace via load lock 39 as discussed in my copending patent application entitled WAFER TRANSFER APPARATUS FOR USE IN A FILM DEPOSITION FURNACE Ser. No. 608,806, filed Feb. 29, 1996, Now U.S. No. 5,582,649. Reactor furnace 19 has been evacuated before receiving the wafers to be processed by turbo-pump 25 via main chamber 23 and gate valve 45. The unused process gases are removed from the reactor, and main chamber 23 by turbo-pump 25 and are forwarded via line 27 to mechanical pump 29 in the scrubber cabinet 4 of FIG. 4. The apparatus of FIG. 4 functions in part to exhaust spent processing gases, including purging gases, to the atmosphere by fan 37 after being scrubbed by dry scrubber 33, which is coupled to mechanical pump 29 via oil trap 35.

Gas cylinders 8, 10, 12, and 14 of FIG. 1, feed the processing gases silane, germane, diborane and phosphine respectively, all in hydrogen, to associated purge panels 3, 3a, 3b, and 3c. Opening valve 20 conveys silane to purge panel output line 24 via regulator 22 which reduces the pressure from cylinder 8 in the conventional manner. The silane, flows through line 24, mass flow controller 26 of controller bank 9, to junction 28 between vent valve 30 and run valve 32. The remaining source gas tanks 10, 12, and 14 are connected to their respective vent/run valve pairs via associated purge panels as shown. High purity hydrogen from gas source 79 passes through line 73 and joins the other process gases via junction 73' of mixing manifold 5. The bank of vent valves 11 are coupled to common vent line 15, which is coupled in turn to gate valve 83 and very high vacuum turbo-molecular pump 71, to be eventually exhausted by exhaust fan 37 in the scrubber cabinet 4 of FIG. 4.

Each pair of vent/run valves are controlled by associated pneumatic solenoids 49, that are in turn controlled by personal computer 51 as is known in the art. The vent/run valves of each valve pair are operated in push/pull so that when a vent valve closes, an associated run valve opens, to convey the source gas to run line 17 such that when an individual run valve is opened at the appropriate time, its associated vent valve is simultaneously closed to provide a smooth transitional switching of the path of gas flow and thus minimize transient variations. This helps to provide the same switching transients for each gas. The gas impulse transients may be characterized as the shape of the pressure v. time curve of the gases located at the reactor furnace 19, just after the run valves are turned on (or off) to feed (or remove) the source gases to the reactor furnace 19 via gas feed or run line 17. If the same switching transients are not provided at the reactor, the actual transients of each source gas must be measured and taken into consideration when programming the gas switching operations of PC 51 and thus the valve actuators 49. This complicates the computer control process of pneumatic solenoids 49, in turn controlling the operation of the vent/run valve pairs. Any transient variation is significant because the exposure times for each layer to be deposited are short as the layers are very thin, and variation of the composition of the films due to transient variations is unacceptable. It should be noted that the transient time can be a significant fraction of the total exposure time for the deposition of each layer.

In accordance with the invention, the gas lines of mixing manifold 5 are preferably arranged in a simple rectangular array as shown in FIG. 1, whereby the path of the gas from each run valve has an equal path length between the run valve and the entrance 17' to common run line 17 and hence to reactor 19. Thus, no gas has a shorter path from its run valve to the reactor than the path length between the other run valves and the reactor entrance. A shorter path length of a first gas relative to a second gas could otherwise result in an uncalled for excess supply of the first gas at the wafers being processed at the beginning of the short deposition interval, and could result in an imbalance of the ratio of the two source gases contacting the wafers. Note that line segment 55 plus line segment 57 has the same length as neighboring line segment 53, and so forth for the remaining run valves. Hence, with this arrangement, the gases will arrive at the reactor at the same time and in the proper proportion. Otherwise, these inequalities would have to be measured, taken into consideration and programmed into PC 51, which complicates the design process. This rectangular grid arrangement of the tubing provides an easy and economical method of constructing the illustrated line layout of the mixing manifold 5 of FIG. 1. Hence, a reactor gas supply means is provided and includes common run line 17 having an exit portion at the reactor and an entrance portion 17' connected to an array of gas feed lines having an equal path length between each nm valve and point 17'.

After use, before gas cylinder changeouts, and from time to time, the apparatus is to be thoroughly purged of the highly toxic source gases. Valve 69 is closed isolating common venturi line 67 from common vent line 15. Gate valve 83 is closed and turbo pump 71 and dry pump 31 are turned off and vented with nitrogen gas emanating from the gas source 79 via line 59. Nitrogen is supplied by gas source 79 of FIG. 3 to vacuum venturi pump 63. Purging of line 67 and thus purge panels 3 is initiated by actuating Venturi pump 63, which reduces the pressure in common venturi line 67 to about 0.5 atmospheres. To purge silane gas from its purge panel, valves 40, 46, and 48 are opened and silane gas is evacuated through venturi pump 63 via common venturi line 67 to a pressure of about 0.5 atmospheres. Conventional pulse purging of the purge panel with high purity nitrogen gas emanating from gas source 79 via line 75 is then performed. Valve 40 is closed and valve 42 is momentarily opened to pressurize the lines in the purge panel to about 2 atmospheres pressure with high purity nitrogen. Valve 42 is then closed and valve 40 opened to evacuate the purge panel lines through the venturi pump 63 to a pressure of about 0.5 atmospheres; two to five purge cycles are sufficient. Purge panels for the other toxic gases are evacuated to about 0.5 atmospheres in similar fashion. Valve 69 is then opened which increases the pressure in the common vent line 15 to about 0.5 atmospheres. At this time the turbo pump 71 and dry pump 31 are mined on and begin to pump down.

Gate Valve 83 is then opened followed by valves 44 and 40 of the silane purge panel. Purge panels for the other toxic gases are evacuated by the turbo in similar fashion. After pumping overnight, the pressure in all lines will be less than about $10^{-9}$ atmospheres.

A second very high vacuum turbo-molecular pump 25 of FIG. 2, thoroughly purges furnace reactor 19 and the run lines of mixing manifold 5, via gate valve 45 and main chamber 23. Importantly, the slightest leak of the highly toxic gases from gas cylinders 1 after shutdown, due to leaky cylinder gas valve 20 for example, is rapidly and easily detected by leak detectors 85 and 87, which preferably comprise mass spectrometers. Furthermore, the high vacuum provides continuous leak checking, to be performed during operation of the system, so that any slight leak will result in detection of a reduction of the aforesaid extremely high vacuum, typically $10^{-9}$–$10^{-11}$ atmospheres, due to a slight leak by leak detectors 85 and 87.

Thus, this feature results in a very safe system since purging of toxic gas is very thorough due to the very high vacuum produced by turbopumps 71 and 25. In contrast, conventional purging is much weaker as it's accomplished by actuating a low vacuum venturi pump for each purge panel, typically about twenty times. This is often not carded out due to laziness of the operator, and thus the resulting purging is weaker than with our procedure and the dire threat from the highly toxic gases is thus increased. With our procedure, the single venturi pump need only be operated a couple of times to lower the pressure to about 0.5 atmospheres, then the very high vacuum turbo-pumps further reduces the pressure to about $10^{-9}$–$10^{-11}$ atmospheres.

Nitrogen is supplied by gas source 79 of FIG. 3 to vacuum venturi pump 65. Purging of line 67 and thus purge panels 3 is initiated by actuating venturi pump 63, which reduces the pressure in common venturi line 67 to about 0.5 atmospheres. A second very high vacuum turbo-molecular pump 25 of FIG. 2, thoroughly purges furnace reactor 19 and the run lines of mixing manifold 5, via pump 45 and main chamber 23. Importantly, the slightest leak of the highly toxic gases from gas cylinders 1 after shutdown, due to leaky cylinder gas valve 20 for example, is rapidly and easily detected by leak detectors 85 and 87, which preferably comprise mass spectrometers. Furthermore, the high vacuum provides continuous leak checking to be performed during operation of the system, so that any slight leak will result in detection of a reduction of the aforesaid extremely high vacuum, typically $10^{-9}$–$10^{-11}$ atmospheres, due to a slight leak by leak detectors 85 and 87. Thus, this feature results in a very safe system since purging of toxic gas is very thorough due to the very high vacuum produced by turbopumps 71 and 25. In contrast, conventional purging is much weaker as it's accomplished by actuating a venturi pump for each purge panel, and actuating each typically about twenty times. This is often not carded out due to laziness of the operator, and thus the resulting purging is weaker than with our procedure and the dire threat from the highly toxic gases is thus increased. With our procedure, the single venturi pump need only be operated a couple of times to lower the pressure to about 0.5 atmospheres, then the very high vacuum turbo-pumps further reduces the pressure to about $10^{-9}$–$10^{-11}$ atmospheres.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. Apparatus for depositing films comprising:
   (a) a reactor for depositing films on semiconductor bodies therein by exposing said bodies to source gases;
   (b) a plurality of source gas cylinders;
   (c) a source gas mixing manifold having a plurality of pairs of vent and run valves each pair being joined together at a junction point;
   (d) a plurality of gas feed lines, each coupled between a source gas cylinder and an associated junction point of said source gas mixing manifold via an associated purge panel of a bank of purge panels;
   (e) reactor gas supply means coupled to said mixing manifold for supplying said reactor with a plurality of source gases;
   (f) exhaust means for exhausting spent gases from said reactor;
   (g) first high vacuum pump means coupled between said exhaust means and said reactor for purging said reactor;
   (h) second high vacuum pump means coupled to said exhaust means;
   (i) a common vent line coupled between the vent valves of the mixing manifold and said second high vacuum pump means;
   (j) venturi vent pump means coupled to said purge panels via a common venturi line;
   (l) a control valve coupled between the venturi vent line and the common vent line;
   (m) means for operating said venturi pump means while maintaining said control valve closed, thereby to partially reduce pressure in said purge panels; and
   (n) means for thereafter operating said second high vacuum pump means while maintaining said control valve open, thereby to fully purge said purging panels and said common vent line by virtue of high vacuum.

2. The apparatus of claim 1 wherein the reactor gas supply means of paragraph (e) includes a common run line having an exit portion at said reactor and having an entrance portion; wherein said source gas mixing manifold includes an array of mixing manifold gas lines coupled between said run valves of the gas mixing manifold and the entrance portion of said common run line, and wherein said mixing manifold gas lines have an equal path length between each run valve and the entrance portion of said common run line.

3. The apparatus of claim 2 wherein said gas mixing manifold gas lines form a rectangular grid pattern.

4. The apparatus of claim 3 wherein said venturi vent pump means comprises a single venturi pump for purging several purge panels.

5. The apparatus of claim 2 wherein said venturi vent pump means comprises a single venturi pump for purging several purge panels.

6. The apparatus of claim 1 wherein said venturi vent pump means comprises a single venturi pump for purging several purge panels.

7. Apparatus for depositing films comprising:
   (a) a reactor for depositing films on semiconductor bodies therein by exposing said bodies to source gases;
   (b) a plurality of source gas cylinders;
   (c) a source gas mixing manifold;
   (d) a plurality of gas feed lines, each coupled between a source gas cylinder and said source gas mixing manifold via an associated purge panel of a bank of purge panels;
   (e) reactor gas supply means coupled between said mixing manifold and said reactor for supplying said reactor with a plurality of source gases;
   (f) exhaust means for exhausting spent gases from said reactor;
   (g) a venturi vent pump means coupled to the purge panels via venting conduit means for initially purging said purge panels by producing a moderate vacuum therein; and
   (h) high vacuum pump means, operative after the operation of said venturi vent pump means, for purging said reactor, said purge panels, and said mixing manifold by producing a very high vacuum in said venting conduit means.

8. The apparatus of claim 7 wherein the reactor gas supply means includes a common run line having an exit portion at said reactor and having an entrance portion; wherein said source has mixing manifold includes an array of mixing manifold gas lines, each coupled between associated run valve of the gas mixing manifold and the entrance portion of said common run line, and wherein said mixing manifold gas lines have an equal path length between each run valve and the entrance portion of said common run line.

9. The apparatus of claim 8 wherein said gas mixing manifold gas lines form a rectangular grid pattern.

10. The apparatus of claim 9 wherein said venturi vent pump means comprises a single venturi pump for purging several purge panels.

11. The apparatus of claim 8 wherein said venturi vent pump means comprises a single venturi pump for purging several purge panels.

12. The apparatus of claim 7 wherein said venturi vent pump means comprises a single venturi pump for purging several purge panels.

13. Apparatus for depositing films comprising:
   (a) a reactor for depositing epitaxial films on semiconductor bodies therein by exposing said bodies to source gases;
   (b) a plurality of source gas cylinders;
   (c) a source gas mixing manifold;
   (d) a plurality of gas feed lines, each coupled between a source gas cylinder and said source gas mixing manifold;
   (e) reactor gas supply conduit means coupled between said source gas mixing manifold and said reactor for supplying said reactor with a plurality of source gases; and
   (f) wherein the reactor gas supply conduit means includes a common run line having an exit portion at said reactor and having an entrance portion; wherein said source gas mixing manifold includes an array of mixing manifold gas lines, each coupled between an associated run valve of the source gas mixing manifold and the entrance portion of said common run line, and wherein said mixing manifold gas lines form a rectangular grid pattern and have an equal path length between each run valve and the entrance portion of said common run line.

* * * * *